United States Patent [19]

Castaing et al.

[11] 4,001,582

[45] Jan. 4, 1977

[54] LOCAL SURFACE ANALYSIS

[75] Inventors: Raimond Castaing, Paris; Guy Blaise, Clichy; Roger Quettier, Le Plessis-Robinson, all of France

[73] Assignee: Agenge Nationale de Valorisation de la Recherche (Anvar), Neuilly-sur-Seine, France

[22] Filed: June 20, 1975

[21] Appl. No.: 588,706

[30] Foreign Application Priority Data

June 28, 1974 France ............................ 74.22722

[52] U.S. Cl. .............................. 250/288; 250/309; 250/423 P; 250/423 R

[51] Int. Cl.² ........................................ H01J 37/26

[58] Field of Search .......... 250/306, 307, 309, 423, 250/424, 425, 288

[56] References Cited

UNITED STATES PATENTS

| | | | |
|---|---|---|---|
| 3,355,615 | 11/1967 | Bihan | 250/423 |
| 3,660,655 | 5/1972 | Wardell | 250/309 |
| 3,770,954 | 11/1973 | Davis | 250/424 |
| 3,864,575 | 2/1975 | Hashmi | 250/423 |

*Primary Examiner*—Craig E. Church

*Attorney, Agent, or Firm*—Lane, Aitken, Dunner & Ziems

[57] ABSTRACT

In an apparatus for local surface analysis of a target sample in which an ion probe is directed to the target for sputtering particles. A chamber having walls heated to a high temperature (above 2200° K as a rule) collects sputtered particles. The particles entering the chamber are subjected to successive adsorptions and desorptions before they leave the chamber for entry into a mass spectrometer. Scanning may be provided as in conventional SIMS systems.

15 Claims, 6 Drawing Figures

LOCAL SURFACE ANALYSIS

BACKGROUND OF THE INVENTION

This invention relates to processes and apparatuses for the local chemical analysis of solids. There are known processes of this kind wherein the emission of secondary particles from the surface part of the solid under analysis is stimulated by photonic or corpuscular irradiation, and an energy or mass analysis is made of the secondary particles collected, since their characteristics correlate fairly closely with the chemical nature of the emitting atoms of the solid. Amongst the most familiar processes of this kind there may be mentioned the E.S.C.A., Auger spectroscopy, and micro-analysis by x-ray spectroscopy or by secondary ion spectroscopy, known as XPS and SIMS.

In secondary ion mass spectroscopy analysis, as described for instance in U.S. Pat. No. 3,660,655, a primary ion bombardment removes atoms and atom groupings from the surface of a solid target sample. Mass spectrographic analysis of the secondary ions thus removed from the surface has the advantage, since the substance is sampled from the solid by sputtering, of having a high resolution in depth (some tens of Angstroms). Since the ions are produced within a few Angstroms from the surface, such a method can provide a very localized analysis to an accuracy of less than 1 micron by localization of the ion bombardment on a very small elementary area, i.e. by using an ion probe as radiation source. The distribution image of the element or isotope under analysis in a relatively extensive region may also be photographically recorded by filtering the ion image of such region. Unfortunately, only a small proportion of the atoms and atom groupings removed from the solid specimen is ionized and direct analysis of the secondary ions from the surface has two shortcomings. The presence of molecular ions which have either come from the specimen itself or have arisen as the result of chemical reactions between the specimen surface and agents present in the ambient residual atmosphere where the vacuum is incomplete limits the sensitivity at low values. Such molecular ions may lead to ambiguous interpretations if they have the same unit mass as the required ion and if the separating power of the mass spectrometer collecting the secondary emission is less than the possible slight difference in mass between the interfering molecular ion and the required ion.

Quantitative interpretation of results is difficult because the level of ionization — i.e. the relationship between the number of atomic ions and the number of neutral atoms — depends for any given element not only on the nature thereof but also upon the nature of the lattice in which such element is present and in particular upon the nature of the chemical bonds between the element and adjacent elements; for instance, the ionization level is much greater (ceteris paribus) in the secondary ionic emission of a compound having an ionic character than in the ionic emission of a metal alloy. The ionizing method disclosed in U.S. Pat. No. 3,660,655 does not completely overcome that problem and has no appreciable effect on the precentage of molecular ions.

SUMMARY OF THE INVENTION

It is an object of this invention to provide a process and an apparatus for local chemical analysis which improves upon the prior art, inter alia by overcoming the above drawbacks without losing the advantages of conventional secondary ion mass spectrography.

According to an aspect of the invention, there is provided a process for local chemical analysis of a target sample, including the steps of sputtering particles from an elemental area of the surface of the target, subjecting the particles sputtered from said elementary area to successive adsorptions and desorptions on wall means heated to a high temperature for ionizing said particles with a probability independent of the nature of the target and dissociating said particles, and subjecting the ionized and dissociated particles to mass spectrometry analysis.

Since the particles sputtered from the surface of the specimen are ionized and dissociated in a separate space, the particles of all types (atoms, groups of atoms which may or may not be ionized) sputtered from the specimen surface and directed within a predetermined solid angle are used in the analysis. The particles may be sputtered for instance by a beam of photons or by a corpuscular probe such as an electron probe or a beam of heavy particles (ions or neutral atoms having an energy of several KeV).

It is not possible to produce distribution images directly by filtering the image of a surface of large area, but scanning may be used for overcoming that problem.

Ionization and dissociation may be performed by collecting the secondary particles sputtered from the sample surface into a chamber in which a high temperature and a very low pressure (at least $10^{-5}$ mm Hg and typically $10^{-7}$ mm) are maintained, the chamber wall being made of a refractory low-vapor-tension metal or compound.

The metal or compound should have a high output energy (at least 4.2 eV) for obtaining a satisfactory positive ionization. Tentalum, tungstene and particularly rhenium fullfil that condition. On the other hand, a material having a low output energy (lower than 3.5 eV) should be used for obtaining negative ionization. Some refractory carbides such as tantalum carbide fulfil that condition. As a general rule, it may be stated that the material constituting the walls of the chamber should be at a temperature of at least 2200° K for obtaining an ionization rate and a desorption which are satisfactory. Quite good results are obtained at a temperature of 3000° K and above.

The refractory metal or compound should have a high purity and particularly its content of elements which do not leave the material rapidly upon heating should be as low as possible.

According to another aspect of the invention, there is provided an apparatus for local chemical analysis of a target sample, comprising means for directing a probe onto an elementary area of the surface of said sample to sputter particles from said surface, wall means limiting a space formed with entry opening means for receiving the particles sputtered from said specimen and directed within a predetermined angle from said target, mass spectrometry means arranged to receive the particles leaving said space through an exit opening, and means for heating said chamber to a high temperature, said space having a large enough internal area relatively to the size of the opening means for repeated adsorptions and desorptions of the particles to take place and to result in substantially complete dissociation of said particles and for ionization of the latter with a probability independent of the nature of said target sample.

The invention is also directed to a system adapted to receive particles which are partly ionized and/or dissociated and to deliver particles which are ionized and substantially completely dissociated to a mass spectrography analysing system, adapted to be incorporated into a conventional secondary ion mass spectrography unit.

The invention will be better understood from the following description of embodiments of the invention, given by way of non-limitative examples.

BRIEF DESCRIPTION OF THE DRAWINGS

In the accompanying drawings:

Referring to FIG. 1, there is shown an apparatus which comprises a base plate 10. A bell shaped cover is placed thereto and limits an air-tight chamber. A vacuum pump (not shown) is provided for providing a vacuum of about $10^{+6}$ torrs in the chamber. That pump is typically a turbomolecular pump since it does not pollute the inner atmosphere. The plate 10 carries two columns 11, 12 which receive wiring and ducts for heating electric supply and circulation of a fluid coolant (typically water). A block 13 carried by columns 11 and 12 is shown in greater detail on FIG. 2 and will be described later. The apparatus also comprises a separating system 14 for separating out ionized particles leaving block 13 according to their mass. System 14, partially shown in FIGS. 1 and 2, can be mass spectrometer which achieves energy selection and momentum selection, successively.

The apparatus also comprises means for sputtering particles from a precisely defined elemental area of the surface of a target sample 15 carried on a rod 16 which adjust the sample in position. A corpuscular probe will typically be used for removing the particles. An oxygen ion source has been used and has provided satisfactory results, but for the fact that it determines a fast oxidation of those parts which are heated to a high temperature. Argon ions may also be used and provide a notable increase of the life of the components. Other possibilities exist, such as the use of a high energy pulsed laser.

The depth from the surface from which particles are sputtered may be adjusted by using incident particles of different energies. When ions of 10 KeV are used, sputtering generally occurs on a depth corresponding to three or four atomic layers. It may be possible to scan in depth, for instance for determining the diffusion profile of an impurity, by scanning several times the same elemental area.

Figure 1:
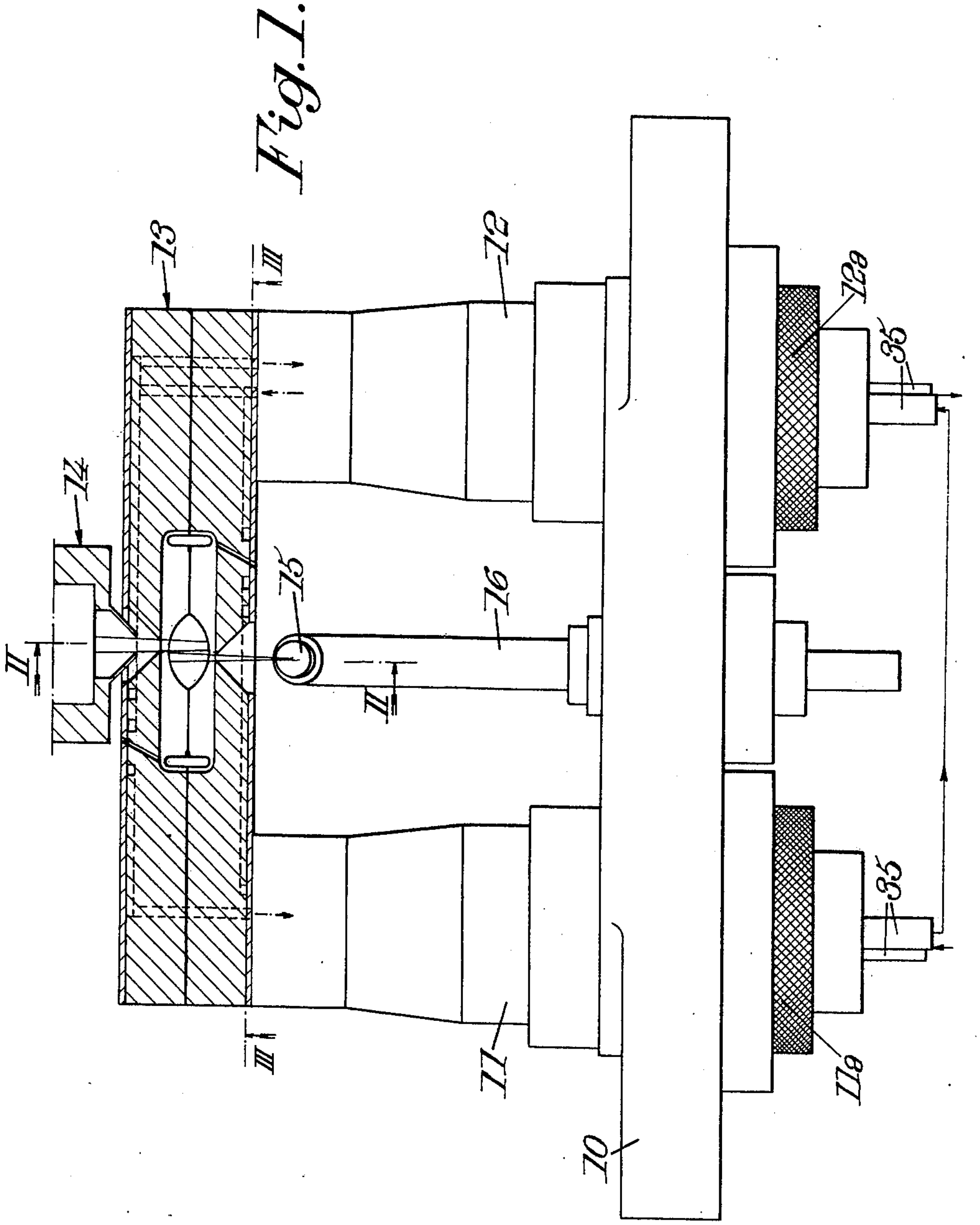
FIG. 1 is a very schematic elevation view showing the main components of the apparatus, partially in cross section along a plane passing through the vertical axis of the apparatus.
Figure 2:
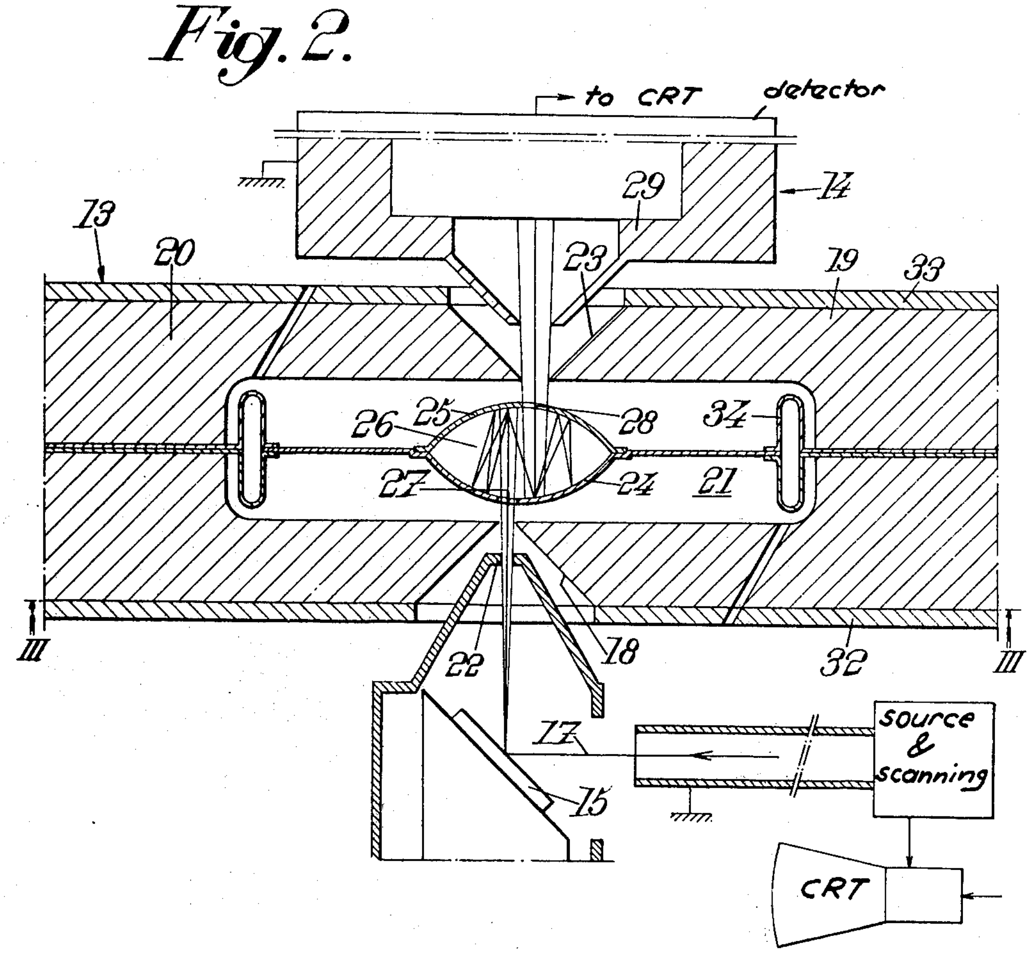
FIG. 2 is a partial view on an enlarged scale, taken along line II—II of FIG. 1.

In the example illustrated on FIGS. 1 and 2, the sample is so positioned that the particles sputtered from the area impinged by the ion probe and emitted within a low volume angle (e.g. $10^{-2}$ strd.) about a direction substantially perpendicular to the direction of the primary ion probe 17 delivered by a source, enter block 13 through an entry aperture 18. A diaphragm 22 at the same electrical potential as the sample 15 determines the angular portion of the secondary beam which enters a chamber 26. Sample 15 and diaphragm 22 are at a common electric potential which can be adjusted to be slightly different (a few volts) from the potential of chamber 26 so that it is possible to energy discriminate between ions from the chamber 26 and possible secondary ions coming directly from sample 15. The angle of incidence is approximately 45° but other values are possible.

Block 13 has two thick copper plates 19, 20 rigidly secured to the columns 11, 12 which are secured to base 10 by two knurled nuts 11*a* and 12*a*. Each plate consists of two half-shells brazed together. The plates are recessed and cooperate to bound a cross passage 18. Plate 19 is formed with an output aperture 23 which is located symetrically of aperture 18 with respect to the center of block 13. The plates 19 and 20 are formed with a network of grooves 31 which are covered by metal sheets 32, 33 and constitute a circuit for the fluid coolant.

An ionization and dissociating chamber 26 is provided in the passage 21. The walls of this chamber 26 consist of two half-shells 24, 25. The plates 19 and 20 form a heat shield about the chamber 26 which is heated to a high temperature. The two half-shells 24, 25 are of a material which is resistant to high temperature, and which has a low vapor pressure at high temperature. The half-shells are rigidly secured to one another e.g. by spot welding or by electron beam welding. The bottom half-shell 24 is formed with an entry orifice 27 which is in alignment with passage 18 and whose size is such that the particle beam from the area of target 15 cannot "illuminate" a similar exit orifice 28 with which the half-shell 25 is formed and which is located along the axis of system 14. This feature ensures that particles coming from the area of the sample which is impinged cannot pass directly to the analyzing system.

Referring to FIG. 2, the extraction lens 29 of the analyzing system is shown only; it constitutes the input element of the system which can otherwise be of conventional construction.

The two half-shells should be of high purity material. For achieving that result, they may be manufactured by pyrolitic deposit of a metal such as tungsten from a chloride or a floride on a substrate which is chemically solved after the deposit is complete.

The half-shells 24, 25 are carried by metal connecting and support strips 30 which are made e.g. of tantalum and which have a U-shaped portion, the same giving the support some flexibility and helping to take up differential expansions. An electric supply (not shown) is provided to circulate a current in the half-shells 24, 25 and to heat them to a temperature which is typically 2500° C or more.

By way of example, the chamber 26 is usually something like 1 cm in diameter whereas the orifices 27, 28 are 1 mm — 1.2 mm in diameter. The respective dimensions are so chosen that the particles ejected from the specimen experience a large number of adsorptions and re-emissions and pass through the chamber 26 many times before leaving through orifice 28.

The number of adsorptions can be estimated from the relationship between the superficial area of the chamber (assumed to be spherical and having a diameter D) to the cross-sectional area presented by orifices 27, 28, each assumed to be of the same diameter *d*. The number of adsorptions is approximately:

$$2 \times (D/d)^2$$

Since there is usually a high probability of the particles dissociating into atoms upon adsorption on the chamber surface, if the volume mass of the gas phase present in the chamber, such gas phase consisting inter alia of the material used for the chamber wall, and the surface density of the adsorbed phase are low, the probability of recombination is also low and the relationship between the number of molecules and the number of atoms in all the particles leaving the chamber through the orifice 28 is very low and virtually negligible in the great majority of cases.

The ionization and dissociation chamber illustrated on FIGS. 1 and 2 is almost completely closed and the time duration necessary to eliminate the pollutants contained in the walls after the chamber has been initially heated is rather long. For decreasing that duration, the construction illustrated in FIGS. 4 and 5 (where the components corresponding to those of FIGS. 1 and 2 are designated by the same reference numbers with the index *a*) may be used.

The chamber **26*a* is limited by two rhenium strips 25*a* and 27*a* whose end portions are clamped between jaws 31 of copper through which the electric current circulates. The jaws are carried by columns similar to columns 11 and 12. The thermal expansion of strips 25*a* and 27*a* when they are heated curves the strips which in operation have the shape illustrated on FIG. 4.** The strips may typically be 10 mm broad and 0.3 mm thick. The maximum thickness of the chamber may be 4 mm, with orifices of about 1 mm. The strips are heated to 3300 ° K by an electric current of several hundreds of amperes under 5 – 10 volts.

The temperature of the strips may be automatically controlled by measuring the ion current from the metal of the strips with a pick-up probe. That current exhibits a fast variation with temperature when the strips are close to their melting point. That current may for instance be about 0.1 nA for rhenium at 3300° K. The output signal of the pick-up probe is delivered to a servocircuit which adjusts the heating electric current for maintaining the ion current at a predetermined value.

The cooling circuit of plates 19 and 20 is connected to delivery and return lines 35. The liquid follows the path indicated schematically on FIGS. 1 and 3.

The operation of the apparatus and the process will now be described in greater detail with reference to some theoritical indications, including orders of magnitude, reference being made to a specific embodiment.

Assuming for instance that it is required to depth-analyze target 15 by applying thereto, by means of a scanning ion probe, a $10^{-6}$ A ion beam at 10 kV, the rate of atom removal from the specimen is about $2.10^{13}$/second, of which approximately 0.5% is collected in chamber 26. Consequently, approximately $10^{11}$ particles/second enter orifice 27 and leave the chamber through the orifices 27 and 28, so that the partial pressure in the chamber is about $10^{-7}$ mm Hg at 2500° C ($d \approx 2$ mm and an atomic mass of $M = 50$ have been assumed).

The average free path between collisions is very much greater than the total path of the particles in the chamber 26 (even having regard to the large number of passages) and the probability of recombination between the particles is very slight. Even at a total pressure in chamber 26 (due inter alia to evaporation from the walls) of $10^{-5}$ mm Hg, the probability of a particle experiencing a collision in the gas phase before leaving the chamber is very slight.

Once the temperature of the heated chamber has been determined, the probabilities of ionization in the positive ion state of the various atoms depend only upon their ionization energy $V_I$. The term for this probability is:

$$\exp - (V_I - \phi)\ kT$$

where $\phi$ denotes the output energy from the chamber walls, $k$ denotes Boltzmann's constant and T denotes the absolute temperature of the chamber.

If is advantageous for emission of positive ions to make the walls of the chamber 26 of a material having a high output energy. For instance, it is possible to use rhenium walls ($\phi \approx 4.9$ eV) with a relatively high ionization potential $V_I$ of 7.6 eV, which is that of a very large number of metals, the ionization probability is of the order of $10^{-5}$ at approximately 2500° K and the ion current flowing through the orifice 28 is $10^{-13}$ A. Ion emission currents of this order are often measured and so the process according to the invention is not disadvantageous in this respect. The probability of ionization can be further increased by raising the temperature of chamber 26. At a temperature at which the vapor pressure of the material used for the chamber 26 is $10^{-4}$ mm Hg, evaporation of the outer walls chamber 26 is sufficient for a loss of thickness of 0.1 mm in about 10 hours, and so this period of time determines the working life of a chamber having a given wall thickness (a few tenths of a millimeter).

At the pressures and temperatures under consideration, the proportion of molecules present in the particles leaving chamber 26 through orifice 28 would usually be very low, bearing in mind the usual values of molecular bonding energies, if thermodynamic equilibrium was reached. However, thermodynamic equilibrium cannot be reached in the limited time for which the molecules remain adsorbed on the chamber walls. However, if the molecules adsorbed on the chamber walls. However, if the molecules have a 0.1 probability of dissociation in an adsorption-desorption process, after about 50 such processes the proportion of molecules is reduced by a factor of approximately 200 relatively to the initial proportion entering chamber 26.

While the positive ionization has been considered in the foregoing, negative ions may also be produced by attachment of electrons to atoms. For instance, in the case of an element whose electronic affinity $V_a$ is about 2 eV, the probability of final desorption in the form of a negative ion is:

$$\exp - (\phi - V_a) / kT \approx 10^{-4}.$$

The material chosen for the chamber 26 is then a material having a low output energy $\phi$, e.g. a refractory carbide such as tantalum carbide ($\phi \approx 3$ eV). In such a case, even if the element has a very low electronic affinity, the probability of final desorption in the form of a negative ion is at least equal to exp $(-\phi/kT)$, corresponding to $10^{-5}$ for $T = 3000°$ K and $\phi = 3$ eV; this is a fairly high probability and leads to substantial ion current flows.

Figure 3:
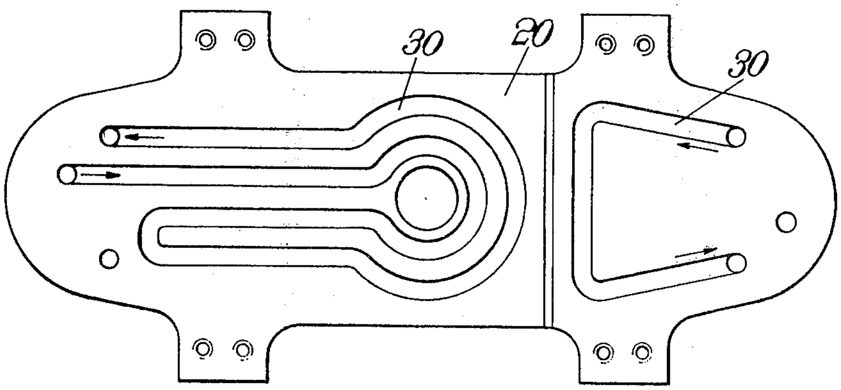
FIG. 3 illustrates the construction of the cooling circuit of the lower heat shield plate, as seen from line III—III on FIG. 2, FIGS. 4 and 5 are schematic elevation and cross sectional views of a dissociation chamber according to a modified embodiment.
Figure 4:
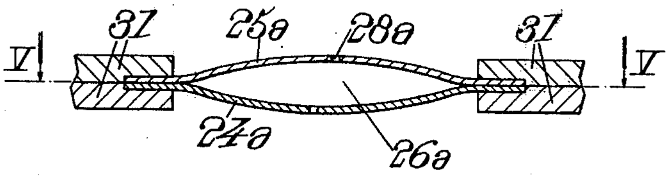
Figure 5:
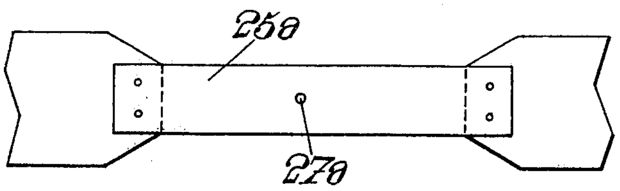

Negative ionization meets with a difficulty. There is a tendency for an electron space charge to build up in the chamber 26 and to oppose the output of ions, particularly if the chamber is formed with small openings only. As a consequence, the embodiment of FIGS. 3 and 4 is then more advantageous than that of FIGS. 1 and 2.

It might be thought that if the electronic affinity of the element concerned is less than the electronic affinity of the atoms of the vapor phase, the negative ions would be neutralized by impacts in the vapor phase; however, such neutralization can occur only during the final passage across chamber 26. At the gas pressures which are found, the mean free path of the atoms between two collisions is very much greater than the diameter of the chamber, and so the neutralization process is practically negligible.

An important point is that the probability of particle ionization depends only upon their nature, upon the nature of the walls of the chamber 26 and upon temperature (the conditions being such that the phase adsorbed on the walls has a much lower surface concentration than a monoatomic layer). The latter probability is independent of the chemical bond of which the corresponding atoms formed part in the specimen. Consequently, the analyzing system collecting the ionized particles issuing through orifice 28 measures ion currents from which the number of atoms of the element or corresponding isotope removed from the bombarded region of the specimen can be deduced. In steady-state conditions, the analysis is quantitative once the thermal ionization probabilities of each of the elements or isotopes removed from the wall of chamber 26 are known. Should the surface concentration formed on the walls of chamber 26 during bombardment of the specimen become high enough to appreciably alter the work function of such walls, the ionization probabilities of the different particles would alter, but the ratio of the ionization probabilities of two species of atom would remain the same since such ratio depends only on temperature and on the difference between the ionization potentials of the two kinds of atom. Consequently, measurements of the concentration ratio at the elemental area of the sample impinged by the probe would remain absolute.

Also, the proportion of polyatomic ions in the beam collected by the analyzing system 14 is usually much less than in the case of secondary ion emission coming directly from the sample 15, so that sources of possible ambiquity are reduced considerably. In any case, the dwell of the particles in the chamber is short enough, despite the large number of passages they make before leaving the chamber, for this form of analysis to be compatible with relatively rapid scanning of specimen 15 by the source supplying the beam 17 (some 1/100th second for 100 $\mu$m × 100 $\mu$m).

In another modified embodiment the chamber 26 is limited by a grid similar to a Venetian blind and maintained at a high temperature, a feature which helps to reduce particle dwell time and to speed up scanning, but at the cost of reducing molecular dissociation.

Figure 6:
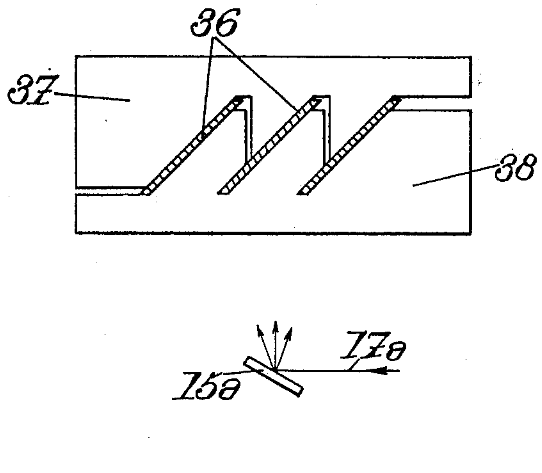
FIG. 6 is a schematic elevation view of a chamber according to another embodiment.

In the embodiment of FIG. 6, the grid comprises three rhenium strips 15 whose end portions are clamped between jaws 37 and 38. The strips are 5 mm broad and angularly located for preventing direct passage of particles from the target to the mass spectrometry system.

If a pulsed scanning probe is used, a movable shutter may be located between the sample 15 and the opening 18. Such a shutter is removed during the pulses and operates as thermal screen between the pulses.

We claim:

1. A process for a local chemical analysis of a target sample, including the steps of sputtering particles from an elemental area of the surface of the target, subjecting the particles sputtered from said elementary area to successive adsorptions and desorptions on wall means heated to a high temperature for ionizing said particles with a probability independent of the nature of the target and dissociating said particles, and subjecting the ionized and dissociated particles to mass spectrometry analysis.

2. A process according to claim 1, comprising the step of directing a corpuscular or photon probe onto said target for sputtering particles therefrom.

3. A process according to claim 1, wherein the particles sputtered from said target and directed at a predetermined angle are received in a chamber limited by sid wall means, said wall means being of a substance having a low vapor pressure and wherein said mass spectrometric analysis is carried out on the particles leaving the chamber through at least an opening of small cross sectional area in said wall means.

4. An apparatus for local chemical analysis of a target sample, comprising means for directing a probe onto an elementary area of the surface of said sample to sputter particles from said surface, wall means limiting a space formed with entry opening means for receiving the particles sputtered from said specimen and directed within a predetermined angle from said target, mass spectrometry means arranged to receive the particles leaving said space through an exit opening, and means for heating said wall means to a high temperature, said space having a large enough internal area relatively to the size of the opening means for repeated adsorptions and desorptions of the particles to take place and to result in substantially complete dissociation of said particles and for ionization of the latter with a probability independent of the nature of said target sample.

5. An apparatus according to claim 4, wherein said space constitutes a chamber formed with an entry orifice and an exit orifice, said orifices having cross sectional areas and being located with respect to each other and with respect to the specimen for preventing sputtered particles from the sample and directed to the entry orifice from leaving the chamber directly through the exit orifice.

6. An apparatus according to claim 4, wherein said space is limited by two half shells made of a temperature resistant material having a low vapor pressure and having a high output energy.

7. An apparatus according to claim 6, wherein said material is selected from the group consisting of tantalum, tungstene and rhenium.

8. An apparatus according to claim 4, wherein the space is limited by wall means of a material having a low vapor pressure at high temperature and having a low output energy.

9. An apparatus according to claim 8, wherein the material is a refractory carbide.

10. An apparatus according to claim 4, wherein said space is limited by two flexible thin strips connected to each other at their ends, one of said strips being formed with an orifice constituting said entry opening and the other strip being formed with an orifice constituting said exit opening.

11. An apparatus according to claim 4, wherein said space is limited by parallel strips spaced and angularly located for preventing particles sputtered from said target sample from leaving said space directly through the exit opening means.

12. An apparatus according to claim 4, wherein said space is located within a recess in a heat sink provided with means for circulating a cooling fluid.

13. An apparatus according to claim 12, wherein said heat sink comprises two plates secured to each other and formed on their external walls with grooves cooperating with covering sheets for limiting said cooling fluid circuit.

14. An apparatus according to claim 4, having means for regulating the temperature of said wall means, comprising means for measuring the value of the current of ions from the wall means and means for adjusting an electric current circulating in said walls for adjusting the temperature of said wall means at a predetermined value.

15. An apparatus according to claim 4, having means for evacuating said space and providing therein a vacuum sufficient for the average free path of particles in said space between collisions to be much greater than the total path of the particles in said space.

* * * * *